United States Patent
Cha

[11] Patent Number: 5,861,668
[45] Date of Patent: Jan. 19, 1999

[54] SEMICONDUCTOR PACKAGE

[75] Inventor: Gi Bon Cha, Choongcheongbuk-Do, Rep. of Korea

[73] Assignee: LG Semicon Co., Ltd., Cheongju, Rep. of Korea

[21] Appl. No.: 785,695

[22] Filed: Jan. 17, 1997

[30] Foreign Application Priority Data

Jun. 14, 1996 [KR] Rep. of Korea .................. 1996/21531

[51] Int. Cl.[6] .................................................. G01L 23/48
[52] U.S. Cl. .......................... 257/692; 257/787; 257/690; 257/693; 257/691
[58] Field of Search ..................................... 257/676, 666, 257/690, 691, 692, 693, 774, 675, 777, 784, 684, 787

[56] References Cited

U.S. PATENT DOCUMENTS

| | | | |
|---|---|---|---|
| 5,302,849 | 4/1994 | Cavasin | 257/666 |
| 5,326,932 | 7/1994 | Sung | 174/52.4 |
| 5,363,279 | 11/1994 | Cha | 361/767 |
| 5,365,408 | 11/1994 | Kwon et al. | 257/676 |
| 5,428,248 | 6/1995 | Cha | 257/676 |
| 5,444,301 | 8/1995 | Song et al. | 257/737 |
| 5,471,088 | 11/1995 | Song | 257/668 |
| 5,483,024 | 1/1996 | Russell et al. | 257/666 |
| 5,648,680 | 7/1997 | Ogawa et al. | 257/666 |
| 5,677,566 | 10/1997 | King et al. | 257/666 |

*Primary Examiner*—Carl W. Whitehead, Jr.
*Attorney, Agent, or Firm*—Fleshner & Kim

[57] ABSTRACT

A semiconductor package of the present invention includes a paddle layer having a metal wiring pattern formed therein, semiconductor chips bonded on at least one surface of the paddle layer. A plurality of wires electrically connecting a plurality of chip pads formed on the semiconductor chips with the paddle layer. Each lead includes a first lead bonded to a surface of the paddle layer and a second lead which is at least partially exposed. A conductive adhesive bonds the paddle layer to the first leads and a molding resin comprises the body of the package. The semiconductor package of the above construction has various advantages compared to conventional packages. The occupying area rate can be minimized, and an undesired curving of the lead can be prevented. Further, since the semiconductor chip can be bonded on both surfaces of the paddle layer, an integrated semiconductor package can be achieved.

23 Claims, 3 Drawing Sheets

SEMICONDUCTOR PACKAGE

TECHNICAL FIELD

The present invention relates to a semiconductor package, and in particular, to an improved bottom lead semiconductor package.

BACKGROUND ART

FIG. 1 is a longitudinal cross-sectional view showing a construction of a SOJ (small outline J-lead) semiconductor package where the external lead has a shape of "J". The conventional semiconductor package includes a semiconductor chip 1 bonded on a paddle 2 by an adhesive 7 and a lead structure having a plurality of internal leads 3 wire-bonded to the semiconductor chip 1 and external leads extending from the internal leads 3. A plurality of metal wires 5 electrically connects the chip 1 and the internal leads 3 of the lead structure, and a molding resin 6 forms the body of the semiconductor package by sealing a predetermined area including the semiconductor chip and the internal leads 3.

When the conventional semiconductor is mounted on the substrate, the occupying area of a package becomes larger due to the external leads protruding from the sides of the semiconductor package body. The occupying area rate becomes higher; the mounting rate is lowered; and an external lead is undesirably curved. Further, since only one chip can be mounted in one package, a multi-chip package is difficult to achieve and a center pad-type semiconductor chip is difficult to package.

DISCLOSURE OF THE INVENTION

The present invention can be achieved at least in part by a chip package, comprising: a first chip having a plurality of chip pads; a paddle layer having first and second surfaces, the paddle layer having a plurality of first connection pads, a plurality of second connection pads, and conductive mediums coupling corresponding first and second connection pads to each other; means for attaching the first chip to the first surface of the paddle layer, and conductively coupling corresponding chip pads to corresponding first connection pads; a plurality of leads with first and second surfaces; means for connectively mounting corresponding second connection pads to a first predetermined portion of the first surface of corresponding leads; and molded resin for packaging the first chip, paddle layer, attaching means, plurality of leads and mounting means.

The present invention can also be achieved at least in part by a paddle layer for a package with a chip having a plurality of chip pads, comprising: an area for mounting the chip; a plurality of first connection pads for conductive connection with the chip pads; a plurality of second connection pads for conductive connection to leads of the package; and conductive mediums coupling corresponding first and second connection pads to each other.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

BEST MODE FOR CARRYING OUT THE INVENTION

Figure 1:
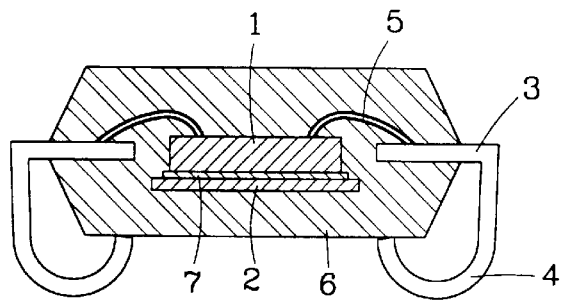
FIG. 1 is a longitudinal cross-sectional view of the conventional SOJ (small outline J-lead) semiconductor package.
Figure 2:
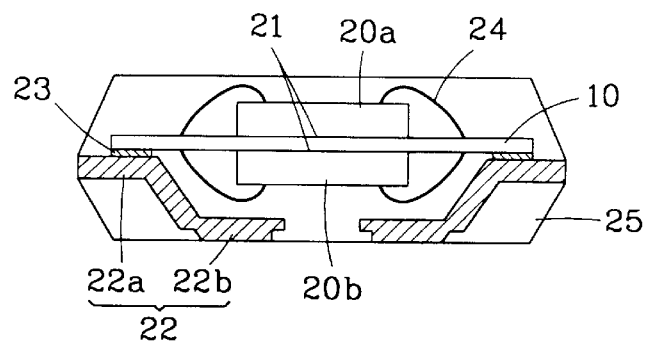
FIG. 2 is a longitudinal cross-sectional view of a bottom lead semiconductor package according to an embodiment of the present invention.

As shown in FIG. 2, semiconductor chips 20a, 20b are bonded near the central area on the top and bottom surfaces of a paddle layer 10, which has a circuit wiring pattern formed therein, using an insulating double-sided tape or a paste-type adhesive 21. The chip pads of the semiconductor chips 20a, 20b and the bonding pads of the paddle layer 10 are connected to each other, respectively.

A plurality of leads comprises a plurality of internal leads 22a and bottom leads 22b. The internal leads 22a of the lead frame 20 are respectively bonded with the lead-connecting pads 13 formed at the sides of the bottom surface of the paddle layer 10 through a conductive adhesive 23. A double-sided tape or a paste-type adhesive is used as the conductive adhesive 23. The bottom leads 22b extend from the internal leads 22a to be down-set at a predetermined depth.

A predetermined area including the wire-bonded semiconductor chips 20a, 20b and the leads 22 are molded by a molding resin 25, resulting in a completed semiconductor package body. The bottom leads 22b are exposed on the bottom of the package body, and are mounted on the substrate (not illustrated) when the package is completed to transmit an electrical signal of the semiconductor chips 20a, 20b to the outside.

Figure 3:
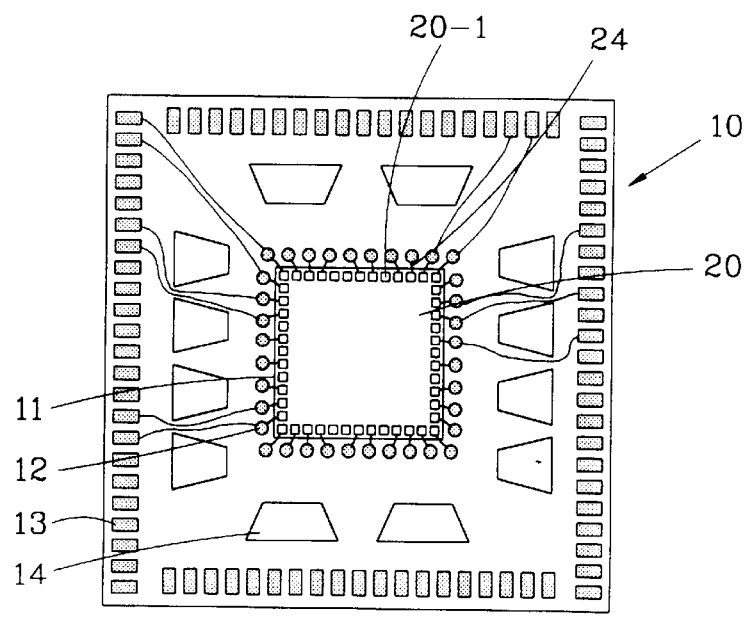
FIG. 3 is a planar view of a semiconductor chip bonded on the paddle layer in FIG. 2.
Figure 7:
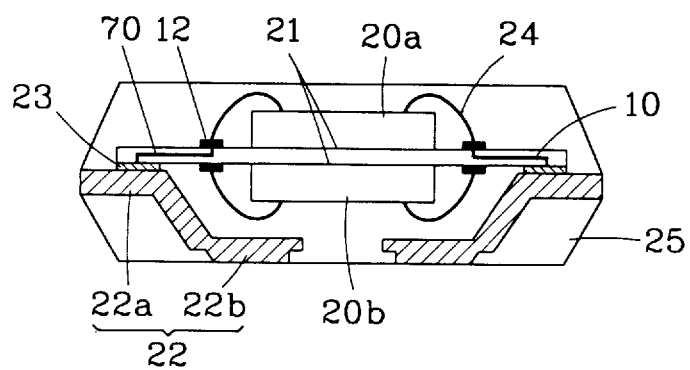
FIG. 7 is a cross-sectional view of a bottom lead semiconductor package according to an embodiment of the invention.

FIG. 3 is a planar view of a semiconductor chip bonded on the paddle layer 10 in FIG. 2 after wire bonding. A semiconductor chip 20 is bonded to the paddle 11 of the paddle layer 10. A plurality of chip pads 20-1 of the chip 20 are connected with a plurality of wire connection pads 12 by wires 24. Around the periphery of the paddle layer 10, lead connecting pads 13 are formed to be respectively connected with the wire connection pads 12 by means of the metal wiring pattern 70 formed in the paddle layer 10, as shown in FIG. 7. Holes 14 are formed in the space between the bonding pads 12 and the lead connecting pad at regular intervals.

Figure 4:
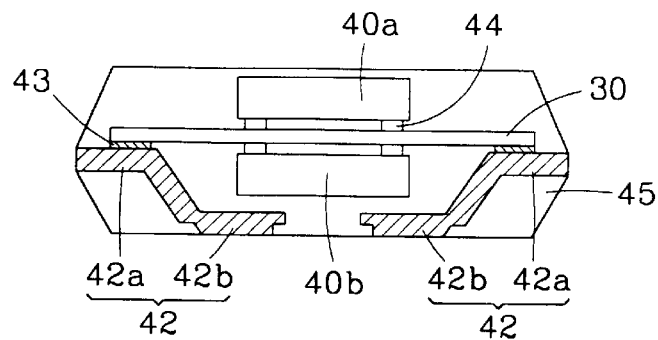
FIG. 4 is a longitudinal cross-sectional view of the bottom lead semiconductor package according to another embodiment of the present invention.

FIG. 4 is a longitudinal cross-sectional view of the bottom lead semiconductor package according to another embodiment of the present invention. Semiconductor chips 40a, 40b are bonded by a plurality of conductive bumps onto the center of the top and bottom surfaces of a paddle layer 30, in which a circuit wiring pattern is formed. A plurality of chip pads formed on the semiconductor chips 40a, 40b and a plurality of bump pads, similar to the wire connection pads 12, formed on the paddle layer 30 are bonded to the corresponding chip pads.

In addition, the lead frame 42 includes a plurality of internal leads 42a and bottom leads 42b, and the internal leads 42a of the lead frame 42 are bonded to the lead-connected pads formed at the sides of the bottom surfaces of the paddle layer 30 through a conductive adhesive 43. The above construction of the lead frame 42 is the same as that of the lead frame 22 in FIG. 2. A double-sided tape or a paste-type conductive adhesive is used as the conductive adhesive 43.

A predetermined area having the semiconductor chips, the paddle layer 30 and the leads 42 is molded by the molding resin 45, resulting in a completed package body. The bottom leads 42b of the leads 42 are exposed to the bottom surface of the package body, and are mounted on the substrate when the package is completed to transmit an electrical signal of the semiconductor chips 40a, 40b to the outside.

In the construction of the semiconductor package in FIG. 4, the chip pads of the semiconductor chips 40a, 40b and the bump connection pads of the paddle layer 30 are electrically connected to each other by conductive bumps 44. An electrical path is shorter than when the same are connected to each other through the wires 24 in FIG. 2, resulting in enhanced electrical characteristics. The entire semiconductor chip having chip pads formed at the center and the sides thereof is packaged more easily by changing a design of a metal wiring pattern of the paddle layer 30. That is, a side pad-type or a center pad-type semiconductor chip is selectively packaged in accordance with whether the bump pad formed on the paddle layer 30 is located at the center or the side.

Figure 5:
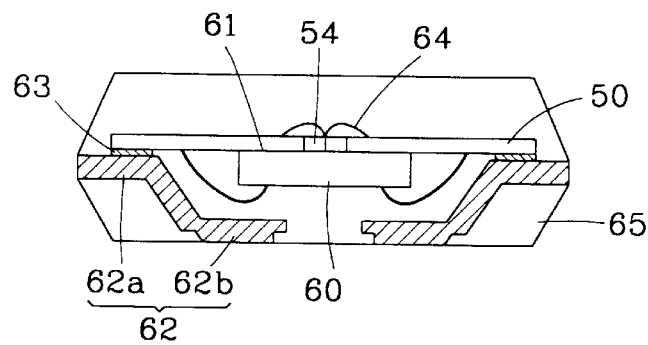
FIG. 5 is a longitudinal cross-sectional view of the bottom lead semiconductor package according to another embodiment of the present invention.

FIG. 5 is a longitudinal cross-section of the bottom lead semiconductor package according to another embodiment of the present invention. A center pad-type semiconductor chip 60 is bonded through an insulating double-sided tape or a paste-type adhesive 61 at the center of the bottom surface of a paddle layer 50, having a circuit wiring pattern therein, and a first hole 54 formed at the center thereof. Chip pads 60-1 formed at the center of the semiconductor chip are exposed through the first hole 54 of the paddle layer 50. The connection pads 51 of a paddle layer 50 and the chip pads 60-1 are respectively connected to each other through conductive wires 64.

The leads 62 comprise a plurality of internal leads 62a and bottom leads 62b, and the internal leads 62a are bonded to the lead-connecting pads 52 formed at the sides of the bottom surface of the paddle layer 50 through a conductive adhesive 63. A double-sided tape or a paste-type adhesive is used as, the conductive adhesive 63. The above construction of the leads 62 is the same as that of the leads 22, 42 in FIGS. 2 and 4.

A predetermined area including the wire-bonded semiconductor chip 60, the lead frame 62 and the paddle layer 50 is molded by molding resin 65, resulting in a completed package body. The bottom leads 62b are exposed on the bottom surface of the package body, and are mounted on the substrate (not illustrated) when the package is completed to transmit an electrical signal of the semiconductor chip 60 to the outside.

Figure 6:
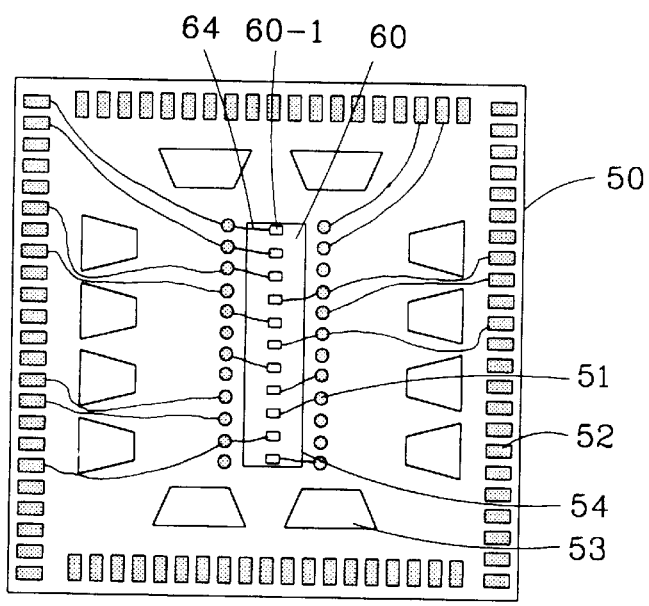
FIG. 6 is a planar view showing a semiconductor chip bonded on the paddle layer in FIG. 5 through a wire bonding.

FIG. 6 is a planar view of the wire-bonded semiconductor chip 60 attached to the paddle layer 50 in FIG. 5. As shown in this drawing, the first hole 54 is formed near the center of the paddle layer 50 to expose chip pads 60-1 when the semiconductor chip having the center pads 60-1 at the center is bonded to the paddle layer 50, and around the first hole 54. A plurality of chip pads 60-1 formed on the chip 60 are bonded to a plurality of connection pads 51 through the wires 64. Around the edge of the paddle layer 50, lead-connecting pads 52 are formed to be bonded to the internal leads 62a through the adhesive 63. In addition, a second hole 53 is formed in the spaces between the bonding pads 51 and the lead-connecting pads 52 at regular intervals. As can be appreciated, the chip pads 60-1 may be connected to the connection pads 51 by solder bumps or other appropriate connections.

As described in detail above, according to the bottom lead semiconductor package of the present invention, since the package is mounted on the substrate by using the bottom lead exposed on the bottom surface of the package, the occupying area rate for the substrate of the package can be minimized, an undesired curving of the lead can be prevented. In addition, since semiconductor chips are bonded on both surfaces of the paddle layer and packaged, an integrated semiconductor package can be achieved, and the entire semiconductor chip having chip pads at the center or sides can be packaged.

The foregoing embodiment is merely exemplary and not to be construed as limiting the present invention. The present scheme may be readily applied to other types of packages where the leads are exposed at a bottom surface or a top surface of the package. For example, the present invention may be applied to the packages disclosed in U.S. Pat. Nos. 5,363,279, 5,428,248, 5,326,932, 5,444,301 and 5,471,088, commonly assigned to the same assignee as this application, and whose disclosures are incorporated herein by reference. Further, the present invention discloses the chip being completely encapsulated by the molding resin. As can be appreciated, the present invention is applicable to packages which do not completely encapsulate the semiconductor chip, i.e., the molding resin packages or molds the semiconductor chip. In the foregoing embodiments, the surfaces were referred to as upper and lower surfaces or top and bottom surfaces for convenience to illustrate the present invention in view of the figures. As can be appreciated, the surface reference is dependent upon the orientation of the package. The description of the present invention is intended to be illustrative, and not limiting the scope of the claims. Many alternatives, modifications and variations will be apparent to those skilled in the art.

I claim:

1. A chip package, comprising:

a first chip having a plurality of chip pads;

a paddle layer having first and second surfaces, said paddle layer having a plurality of first connection pads, a plurality of second connection pads, and electrically conductive media coupling corresponding first and second connection pads to each other;

means for attaching said first chip to said first surface of said paddle layer, and conductively coupling corresponding chip pads to corresponding first connection pads;

a plurality of leads with first and second surfaces, wherein each of the leads has an internal portion and a bottom portion, and wherein said second surface of the bottom portion of each of the leads is exposed on a bottom surface of the chip package;

means for connectively mounting said second connection pads to the first surface of said internal portions of corresponding leads; and molded resin for packaging said first chip, paddle layer, attaching means, plurality of leads and mounting means.

2. The chip package of claim 1, wherein said second surfaces of said bottom portions of said plurality of leads are substantially co-planar with outer surfaces of said molding resin.

3. The chip package of claim 1, wherein said molded resin encapsulates said first chip, paddle layer, attaching means, mounting means and a predetermined portion of said plurality of leads.

4. The chip package of claim 1, wherein the first chip is partially molded by the molded resin such that at least one surface of said first chip is exposed.

5. The chip package of claim 1, wherein said internal portions of said leads are parallel with said bottom portions after being bent from an end of the bottom portions.

6. The chip package of claim 5, wherein said mounting means couples said second surface of the paddle layer to said first surfaces of said internal portions of said leads.

7. The chip package of claim 1, wherein said electrically conductive media comprise electrically conductive wires embedded in said paddle layer.

8. The chip package of claim 1, wherein said attaching means comprises:
    an adhesive to insulatively attach said first chip to said first surface of said paddle layer; and
    a plurality of wires for conductively coupling said plurality of chip pads to said first connection pads.

9. The chip package of claim 1, wherein said attaching means comprises a plurality of conductive bumps coupling said plurality of chip pads to said first connection pads.

10. The chip package of claim 8, wherein said paddle layer further includes an opening and said plurality of chip pads are center chip pads located at a central area of a surface of said chip, said chip being attached to said paddle layer such that mid center chip pads are exposed through said opening of said paddle layer to allow said wires to pass through said opening to conductively couple said center chip pads to said first connection pads.

11. The chip package of claim 1, wherein said second connection pads substantially surround said first connection pads.

12. The chip package of claim 1, further comprising a second chip, wherein said attaching means attaches said second chip to said second surface of said paddle layer, and conductively couples corresponding chip pads of said second chip to corresponding first connection pads.

13. The chip pad of claim 1, wherein said mounting means is one of conductive double-sided tape and paste-type adhesive.

14. A paddle layer for a package with a chip having a plurality of chip pads, comprising:
    a substrate having a first side and a second side opposite the first side;
    an area on at least one of said first and second sides for mounting the chip;
    a plurality of first connection pads on said first side of the substrate for conductive connection with said chip pads;
    a plurality of second connection pads on said second side of the substrate for conductive connection to leads of the package; and
    electrically conductive media coupling corresponding first and second connection pads to each other.

15. The paddle layer of claim 14, wherein said area includes an opening to allow center chip pads to be exposed for connection with said plurality of first connection pads.

16. The paddle layer of claim 14, wherein said electrically conductive media are a plurality of wires formed in the paddle layer.

17. The paddle layer of claim 14, wherein said plurality of first connection pads are formed substantially around said area.

18. The paddle layer of claim 17, wherein said second connection pads substantially surround said plurality of first connection pads.

19. The paddle layer of claim 18, further comprising a plurality of holes formed in between said plurality of first and second connection pads at regular intervals.

20. The chip package of claim 1, wherein apertures are formed in said paddle layer between said first and second connection pads.

21. The chip package of claim 1, wherein said first connection pads and said second connection pads are located on opposite sides of said paddle layer.

22. A paddle layer for a semiconductor chip package, comprising:
    a substrate having a central aperture;
    a plurality of first connection pads for conductive connection to chip pads of a semiconductor chip;
    a plurality of second connection pads for conductive connection to leads of a semiconductor chip package; and
    conductive media coupling said plurality of first connection pads to corresponding ones of said second connection pads.

23. The paddle layer of claim 22, wherein said substrate includes a chip mounting area that surrounds said central aperture such that center chip pads of a semiconductor chip are attachable to corresponding ones of said first connection pads when a chip is mounted on said chip mounting area.

* * * * *